United States Patent [19]

Awano

[11] Patent Number: 5,543,749
[45] Date of Patent: Aug. 6, 1996

[54] RESONANT TUNNELING TRANSISTOR

[75] Inventor: Yuji Awano, Tokyo, Japan

[73] Assignee: Fujitsu Limited, Kawasaki, Japan

[21] Appl. No.: 363,989

[22] Filed: Dec. 27, 1994

Related U.S. Application Data

[63] Continuation of Ser. No. 985,243, Dec. 2, 1992, abandoned, which is a continuation of Ser. No. 690,396, Apr. 25, 1991, abandoned, which is a continuation of Ser. No. 416,004, Oct. 2, 1989, abandoned, which is a continuation of Ser. No. 323,244, Mar. 13, 1989, abandoned, which is a continuation of Ser. No. 25,652, Mar. 13, 1987, abandoned.

[30] Foreign Application Priority Data

Mar. 13, 1986 [JP] Japan ................... 61-53725

[51] Int. Cl.$^6$ .......................... H01L 29/737; H01L 29/15
[52] U.S. Cl. ................. 327/570; 257/15; 257/17; 257/23; 257/26; 257/29
[58] Field of Search ............................ 357/16, 4, 12; 257/15, 17, 23, 25, 26, 29; 327/570

[56] References Cited

U.S. PATENT DOCUMENTS

| | | | |
|---|---|---|---|
| 4,205,329 | 5/1980 | Dingle et al. | 357/16 |
| 4,396,931 | 8/1983 | Dumke et al. | 357/16 |
| 4,617,724 | 10/1986 | Yokoyama et al. | 357/16 |
| 4,620,206 | 10/1986 | Ohta et al. | 357/16 |
| 4,712,121 | 12/1987 | Yokoyama | 357/16 |

FOREIGN PATENT DOCUMENTS

| | | | |
|---|---|---|---|
| 0070211 | 1/1983 | European Pat. Off. | 357/16 |
| 0068064 | 5/1983 | European Pat. Off. | 357/4 |
| 0133342 | 2/1985 | European Pat. Off. | 357/16 |
| 0159273 | 10/1985 | European Pat. Off. | 357/4 |
| 2607940 | 9/1977 | Germany | 357/16 |
| 58-142574 | 8/1983 | Japan | 357/4 |
| 60-10775 | 1/1985 | Japan | 357/16 |
| 62-229878 | 10/1987 | Japan | 357/16 |
| 2128026 | 9/1983 | United Kingdom | 357/16 |

OTHER PUBLICATIONS

"Resonant Tunneling Transistor with Quantum Well Base and High–Energy Injection: A New Negative Differential Resistance Device", Federico Capasso et al., J. Appl. Phys. 58(3), Aug. 1, 1985, pp. 1366–1368.

"New Negative–Resistance Device By A Chirp Superlattice", Electronics Letters, Sep. 29, 1983, vol. 19, No. 20, 822–823.

I.B.M. Tech. Discl. Bulletin vol. 29, No. 7, Dec. 1986.

Chen et al. "Enhanced Ballistic Transport in IAGaAs/InAlAs Hot Electron Transistor." Aug. 24, 1987, 1254–1255 of Appl. Physics. 357434.

Primary Examiner—William D. Larkins
Attorney, Agent, or Firm—Staas & Halsey

[57] ABSTRACT

A heterojunction semiconductor device includes an unipolar transistor having, a collector layer, a base layer, a collector side barrier layer provided between the collector layer and base layer, an emitter layer, and an emitter side barrier layer provided between the base layer and the emitter layer. The emitter side barrier layer has a thickness for tunneling a carrier from the emitter and base layer and injecting the carrier into the base layer according to a predetermined voltage applied between the emitter and base layers, the base layer includes a superlattice structure. The superlattice structure includes a plurality thin barrier layers and a thin well layer for forming a mini-band through which the injected carrier can move and a mini-band gap with which the injected carrier collides.

8 Claims, 11 Drawing Sheets

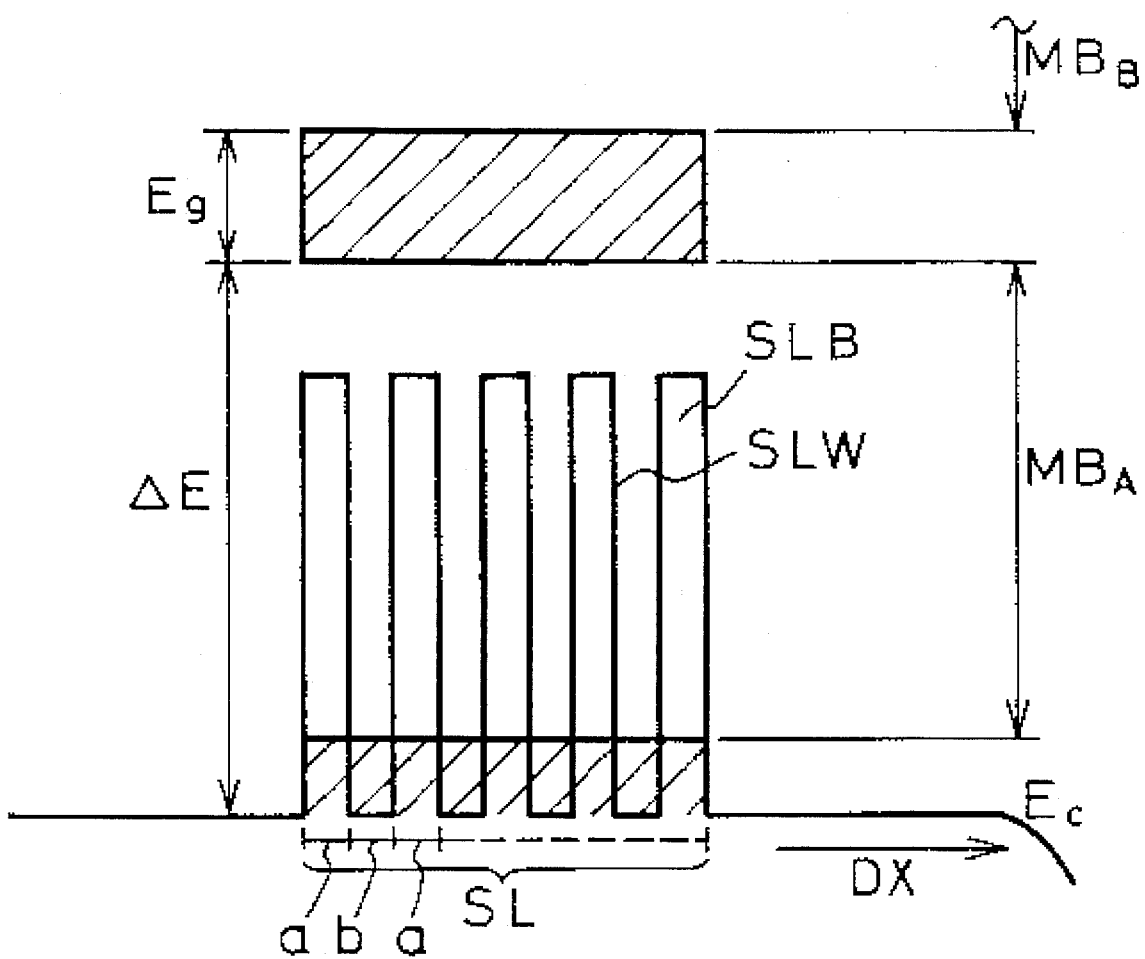

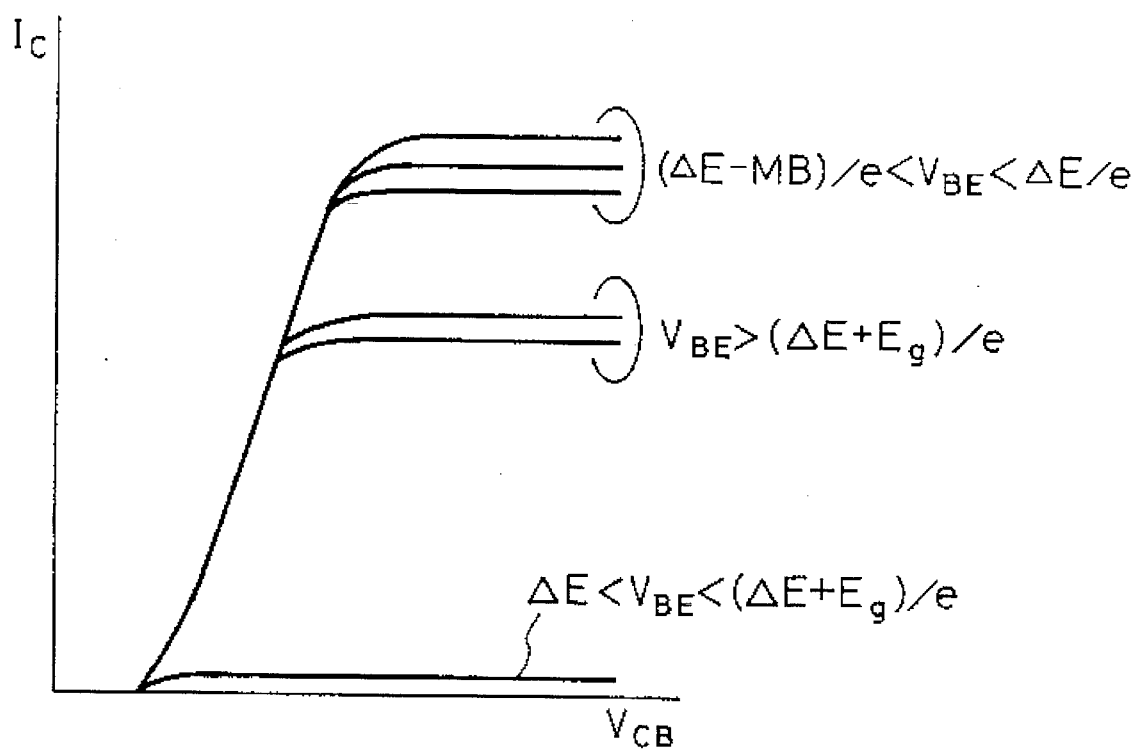

RESONANT TUNNELING TRANSISTOR

This application is a continuation of application No. 07/985,243, filed Dec. 2, 1992, now abandoned, which is a continuation of application No. 07/690,396, filed Apr. 25, 1991, abandoned, which is a continuation of application No. 07/416,004, filed Oct. 2, 1989, abandoned, which is a continuation of application No. 07/323,244, filed Mar. 13, 1989, abandoned, which is a continuation of application No. 07/025,652, filed Mar. 13, 1987, abandoned.

BACKGROUND OF THE INVENTION

1. Field of the Invention

The present invention relates to a heterojunction semiconductor device, more particularly, it relates to a high speed heterojunction semiconductor device having negative resistance and multi-functions, for example, logic operation, multi-valued memory, etc.

2. Description of the Related Art

Recently, the study and development of semiconductor devices using a superlattice formed by laminating barrier layers and well layers has increased. It is well known that the superlattice has interesting properties, for example, the property of a mini-band gap.

FIG. 1 is an energy band diagram of a mini-band gap.

In FIG. 1, SL denotes a superlattice, SLB a barrier layer, SLW a well layer, $E_C$ a bottom of a conduction-band $MB_A$ and $MB_B$ mini-bands, Eg a mini-band gap, ΔE a position of the mini-band gap, Dx a distance, and a and b periods. In this superlattice, the mini-band gap Eg and the position ΔE thereof are changed by changing the periods a, b and the material thereof.

Conventionally, it is known that one of a semiconductor device using the mini-band gap in the superlattice as a barrier to electrons which are injected is a two terminal element having a modulation superlattice.

FIG. 2 is an energy band diagram of a modulation superlattice wherein the same reference marks as used in FIG. 1 denote the same elements.

In FIG. 2, MSL and el denote a modulation superlattice and injected electrons. As is apparent from FIG. 2, in the modulation superlattice MSL, by changing the periods a, b together with the distance DX, for example, in this case by shortening the periods a and b, the position ΔE of the mini-band gap Eg is changed. Namely, since the periods a and b are shortened, the height of the position ΔE is increased.

When a voltage ΔV is applied to the two-terminal element having the modulation superlattice, i.e., between the terminals Ⓐ and Ⓑ, the bottom $E_C$ of the conduction band is inclined, and thus the mini-band gap Eg becomes substantially horizontal, as shown in FIG. 3.

In FIG. 3, a mark eΔV denotes energy corresponding to an applied voltage ΔV. In the state shown in FIG. 3 when an electron el is injected the mini-band gap Eg acts as a barrier against the injected electron el, and when electron el collides with the barrier, the electron el is reflected therefrom so that a current does not flow between the two terminals Ⓐ, Ⓑ.

FIG. 4 is a graph of the current-voltage characteristic of the above two terminal element.

As can be seen from FIG. 4, the current-voltage characteristic has the effect of a negative resistance.

The two terminal element explained by FIGS. 1 to 4 is of course one of a diode and is not a three terminal element having an amplifying function, etc. Further, it does not act as a control element. Since in order to produce the modulation superlattice, the periods should be continuously and controllably changed by an order of a few Å, the two terminal element has many technically difficult problems.

J. Appl. Phys. 58(3), "Resonant Tunneling Transistor with Quantum Well Base and High-Energy Injection". A new negative differential resistance Device, by Federico Capasso and Richard A. Kiehl, published Aug. 1, 1985, disclosed a new negative conductance device consisting of a heterojunction bipolar transistor with a quantum well and a symmetric double barrier or a superlattice in the base region.

In the structure disclosed in the above paper, as shown in FIG. 5, an electron is tunneled through a mini-band having a height lower than a height of a barrier of a superlattice. However, in this structure, since the thickness of the GaAs well layer in the superlattice is large, i.e., 40 Å, the width of the mini-band MB is very narrow and the width of the mini-band gap Eg is very narrow. Therefore, the quantity of the tunneled electrons is small so that the collector current is very small. In addition, the margin of the current-voltage characteristic of the negative resistance is very small so that the design of the device becomes very difficult.

It is assumed that the superlattice having a thinner well layer is applied to the above device in FIG. 5 so that the superlattice in the base layer has a wider mini-band and mini-band gap. Since the structure comprises a npn type bipolar transistor, the bias voltage between base and emitter must be large enough to make the injected electrons have high energy which corresponds to the high energy mini-band gap Eg. If the bias voltage between base and emitter is so large, the holes are injected from the base to emitter so that the bipolar transistor cannot operate as an amplifier. Japanese Unexamined Patent Publication (Kokai) discloses an npn-type bipolar transistor. Since the transistor is a bipolar transistor, hot electron can not be used.

SUMMARY OF THE INVENTION

It is an object of the present invention to provide a heterojunction semiconductor device having a three terminal element and a negative resistance.

It is another object of the present invention to provide a unipolar transistor heterojunction semiconductor device wherein current switching can be carried out by utilizing a reflection of a carrier, for example, electrons, from a mini-band formed in a superlattice region.

According to the present invention there is provided a heterojunction semiconductor device comprising an unipolar transistor including, a collector layer, a base layer, a collector side barrier layer provided between the collector layer and base layer, an emitter layer, and an emitter side barrier layer provided between the base layer and emitter layer and having a thickness for tunneling a carrier from the emitter and base layer and injected into the base layer according to a predetermined voltage applied between the emitter and base, the base layer having a superlattice means. The superlattice means comprises a plurality of thin barrier layers and a thin well layer for forming a mini-band through which the injected carrier can move and a mini-band gap with which the injected carrier collides.

DESCRIPTION OF THE PREFERRED EMBODIMENTS

The present invention will now be described with reference to the drawings.

Figure 6:
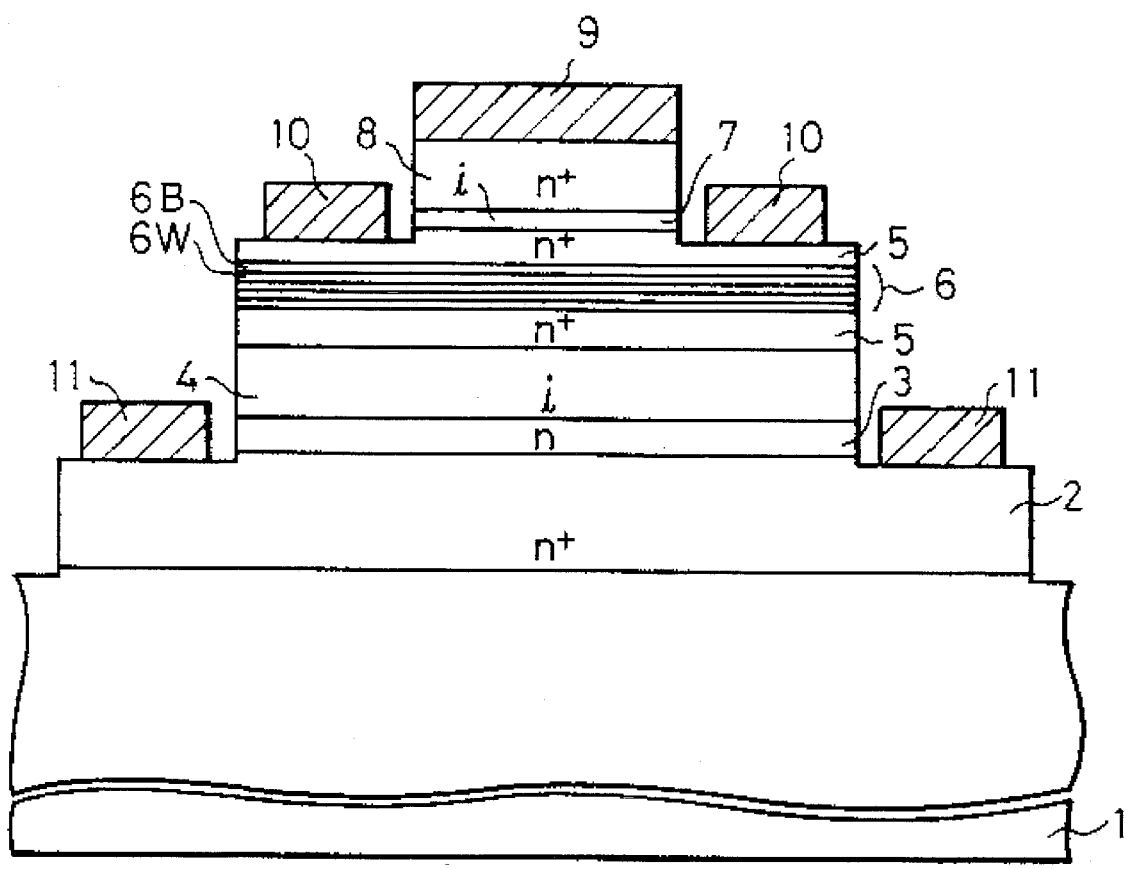
FIG. 6 is a main portion cross-sectional view of an heterojunction semiconductor device according to the present invention.

FIG. 6 is a main portion cross-sectional view of a first embodiment of a heterojunction semiconductor device according to the present invention.

As shown in FIG. 6, an $n^+$-type GaAs collector contact layer 2 having a thickness of about 0.6 μm and an impurity concentration of $5 \times 10^{18}$ cm$^{-3}$ is provided on a semi-insulating layer 1. Further, on the $n^+$-type GaAs collector contact layer 2, an n-type GaAs collector layer 3 is formed having a thickness of about 500 Å and an impurity concentration of about $5 \times 10^{-17}$ cm$^{-3}$. An i-type $Al_xGa_{1-x}As$ (x=0.4) collector side potential barrier layer 4 having a thickness of about 2000 Å is formed on the collector layer 3. $N^+$-type GaAs base layers 5 are formed on the barrier layer and sandwich a superlattice 6. The base layers have a thickness of about 500 Å respectively, an i-type $Al_xGa_{1-x}As$ (x=0.4) emitter potential barrier layer 7 having a thickness of about 200 Å is formed on the base layers and a $n^+$-type GaAs emitter layer having a thickness of about 5000 Å and an impurity concentration of about $5 \times 10^{18}$ cm$^{-3}$ formed on the emitter potential barrier layer 7.

The superlattice 6 includes i-type $Al_xGa_{1-x}As$ (x=0.3) barrier layers 6B and i-type or $n^+$-type GaAs well layers 6W having a thickness of 17 Å, preferably below 30 Å, respectively. The total number of barrier layers 6B and well layers 6W is from 10 to 30. If there are 20 layers, the total thickness substantially thereof becomes 340 Å. An emitter electrode 9 made of Au/Ni/AuGe or Au/AuGe, etc., and having a thickness of 3000 Å, is provided on the $n^+$-type GaAs emitter layer 8, base electrodes 10 made of the same material as the emitter electrode 9 and having a thickness of about 1600 Å are provided on the $n^+$-type GaAs base layer 5, and collector electrodes 11 made of the same material as the emitter electrode 9 and having a thickness of about 3000 Å are provided on the $n^+$-type collector contact layer 2.

Figure 7A:
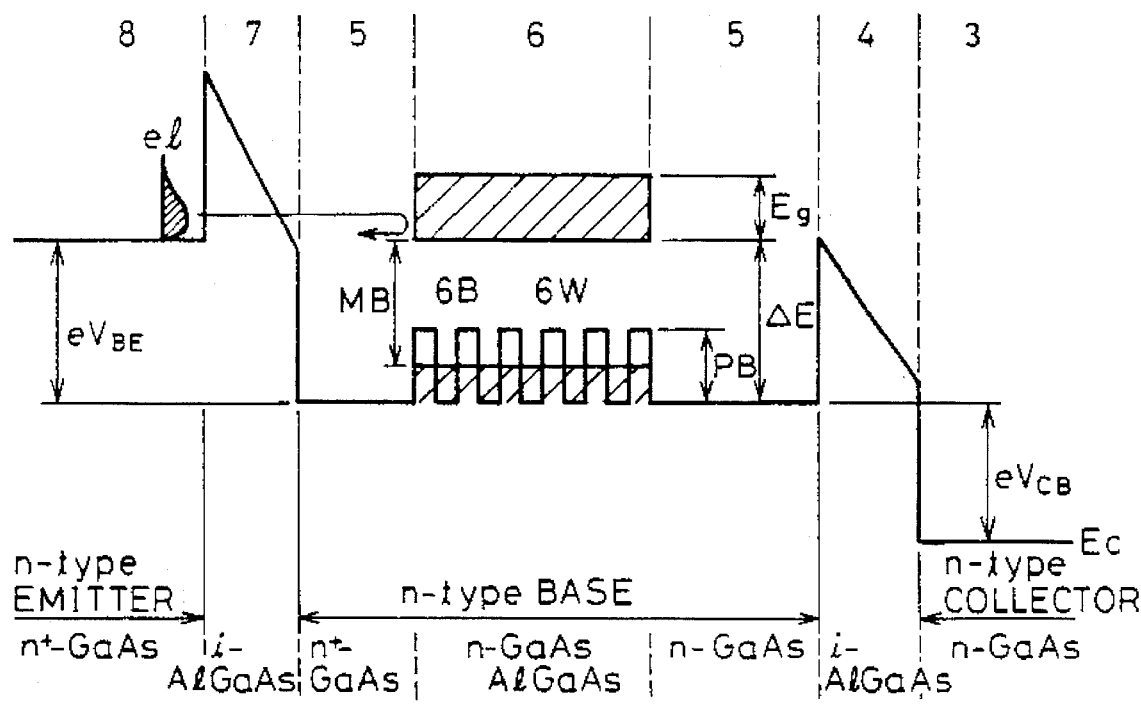
FIG. 7A is an energy band diagram of FIG. 6 under a bias condition.

FIG. 7A is an energy band diagram in the first embodiment of FIG. 6.

In FIG. 7A, MB denotes a mini-band, PB a barrier height of a barrier layer 6B, $eV_{BE}$ an energy corresponding to a voltage applied between a base and an emitter, and $eV_{BC}$ an energy corresponding to a voltage applied between a base and a collector. In these marks, e is an absolute value and an energy is calculated by V×e. In this embodiment, PB is about 0.3 eV, and ΔE is about 0.5 eV. The barrier height of the barrier layers 7 and 4 is about 0.5 eV. Furthermore, the energy level (ΔE–MB) is about half of PB.

The first embodiment is formed in such a manner that a superlattice 6 is interposed between base layers 5 in a so-called hot electron transistor (HET).

Since a part of the base layers 5 have a low resistance and have substantially the same voltage applied as in the superlattice 6, the region of the superlattice 6 has substantially the same potential, with the result that the mini-band gap Eg is horizontally maintained.

In this first example as shown in FIG. 7A, a voltage $V_{BE}$ corresponding to the energy position ΔE of the mini-band gap Eg is applied between the base layer and emitter layer. In such a voltage condition, an electron el injected into the base layer 5 from the emitter layer 8 collides with the mini-band gap Eg and is reflected therefrom, so that it is returned to the emitter layer 8.

When the thickness of the base layer 5 is designed to be sufficiently smaller than a mean free path in which the electron el is scattered, all of the returned electrons el are absorbed by the emitter layer 8, without a loss of energy incurred by the scattering in the return movement.

Figure 7B:
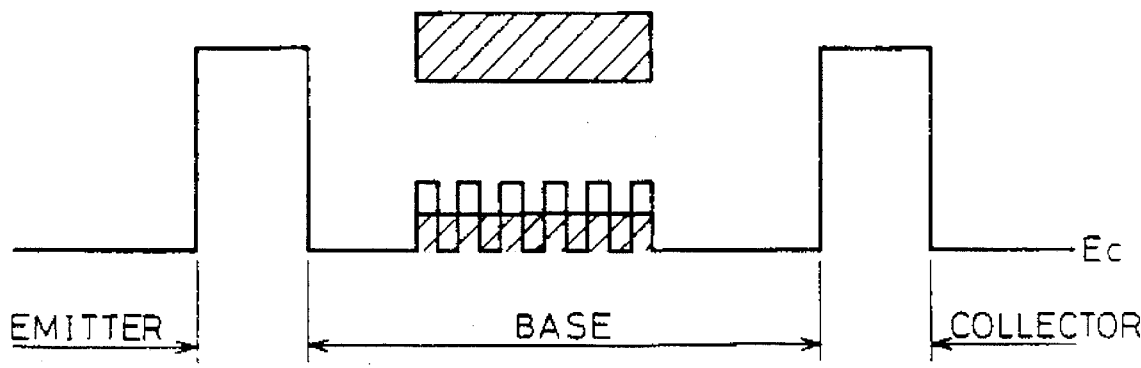
FIG. 7B is an energy band diagram of FIG. 6 under an equilibrium bias condition.

FIG. 7B is an energy band diagram when the first embodiment of FIG. 6 is in an equilibrium state.

Figure 8:
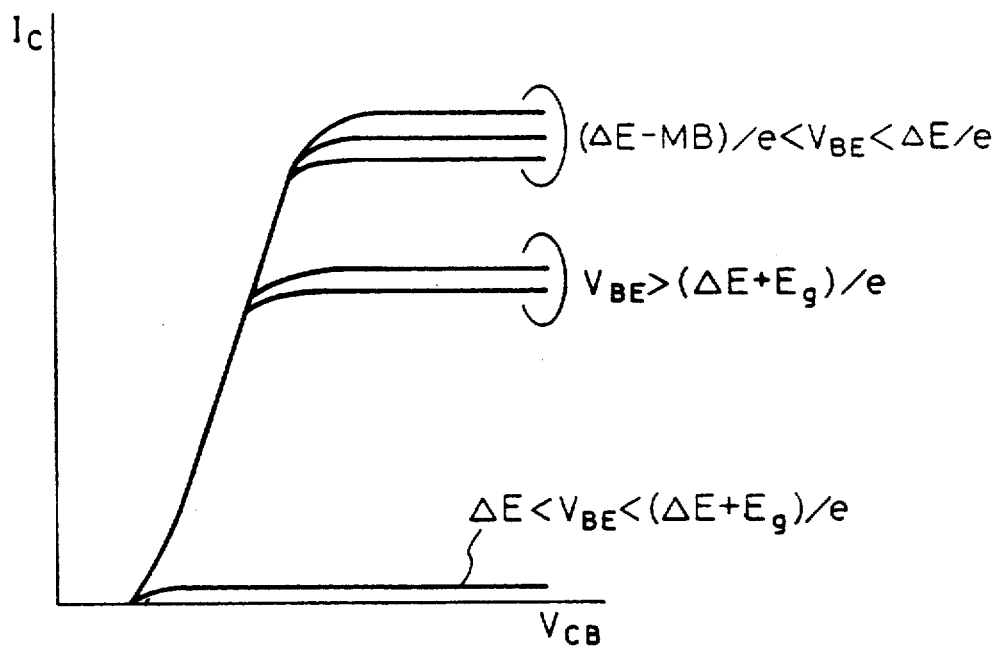
FIG. 8 is a graph of a voltage ($V_{CB}$ between the collector and base)-current (collector current $I_c$) characteristic in FIG. 6.
Figure 9:
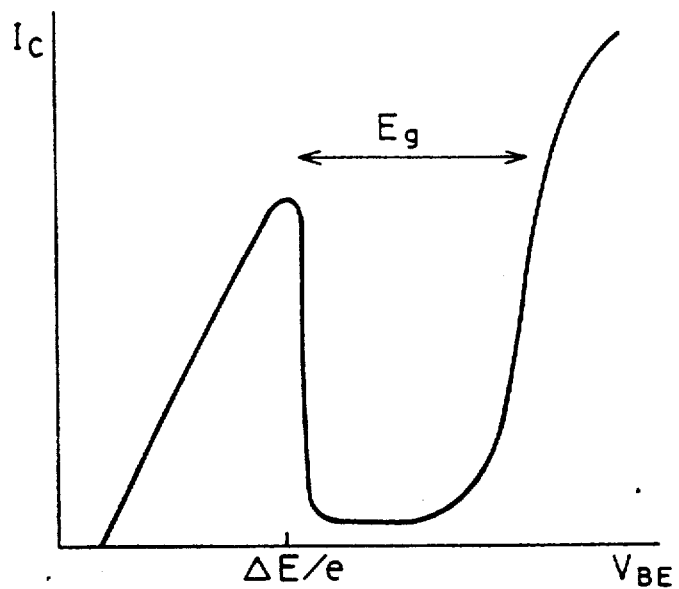
Figure 10A:
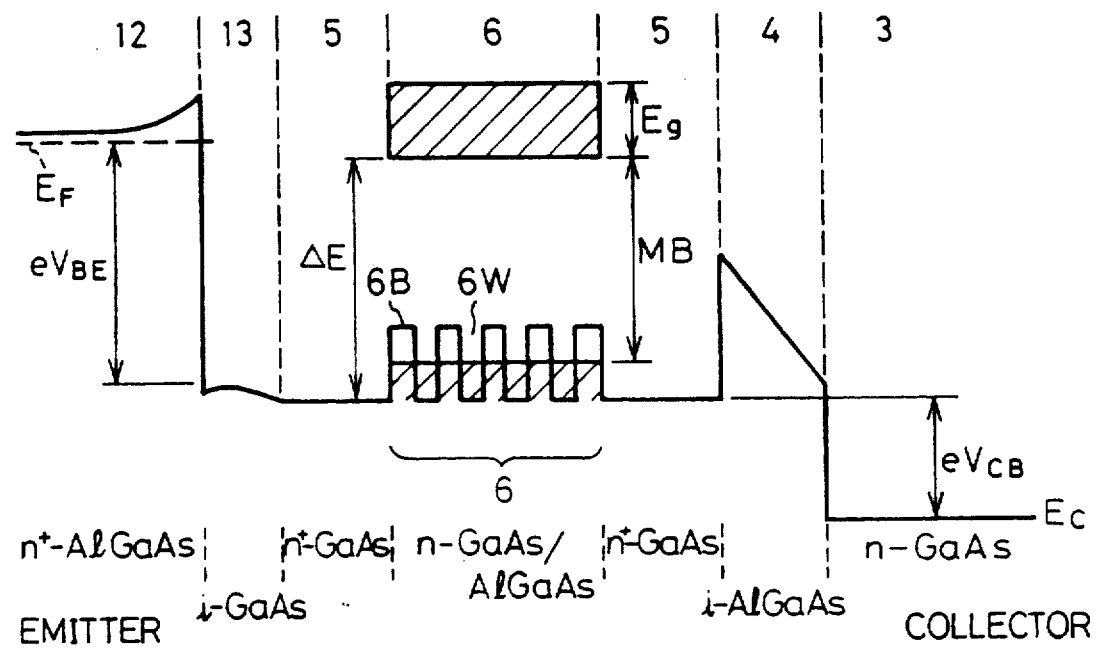
Figure 10B:
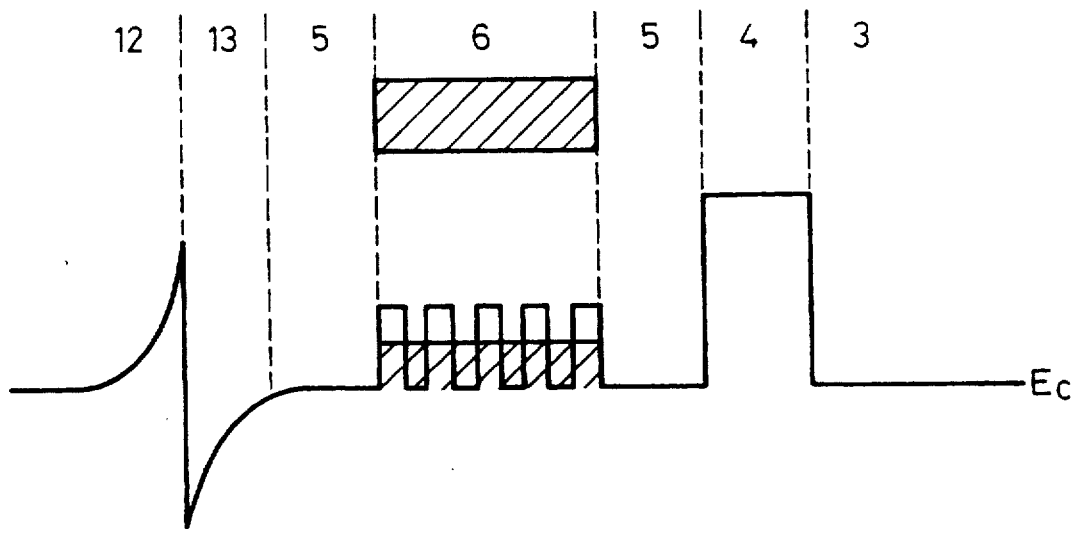
Figure 11:
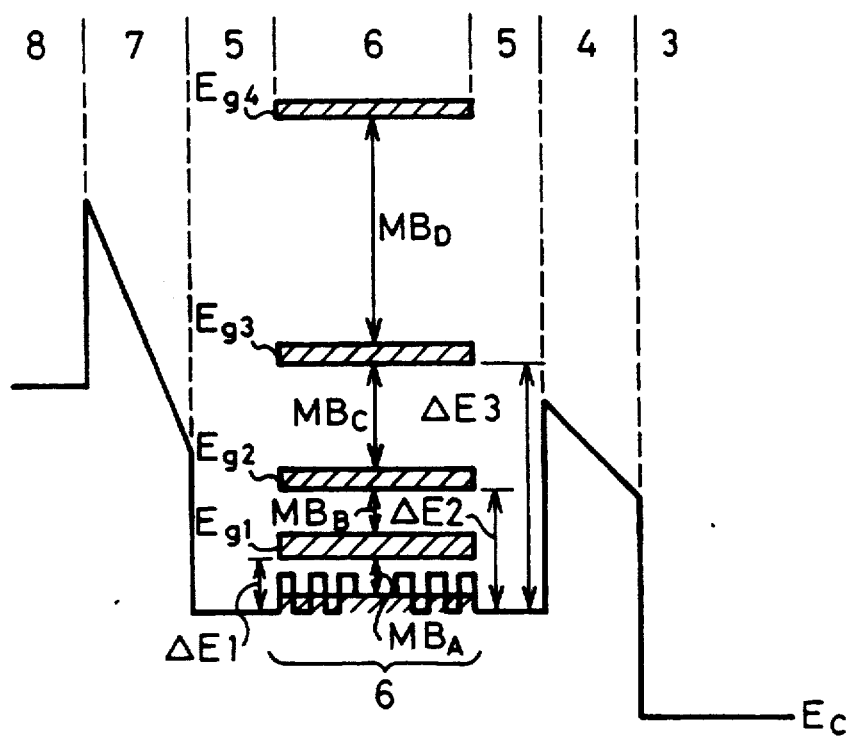
Figure 12:
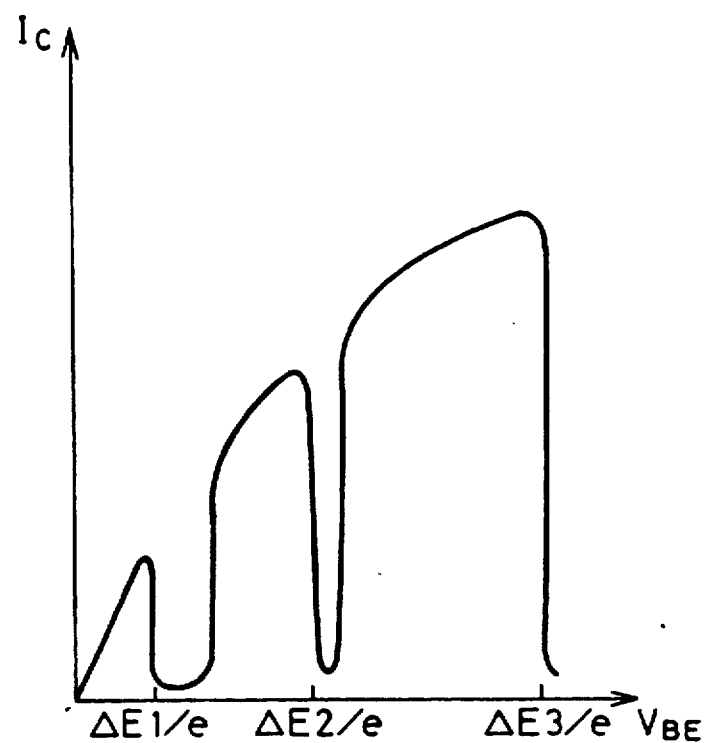
Figure 13A:
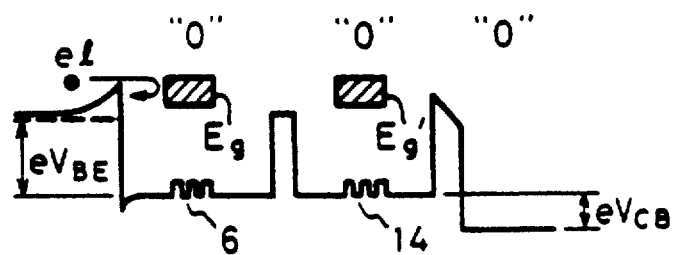
Figure 13B:
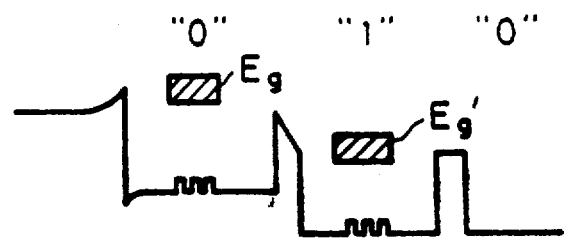
Figure 13C:
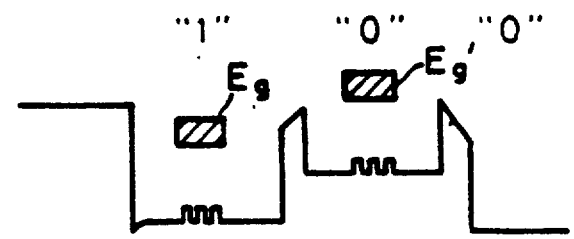
Figure 13D:
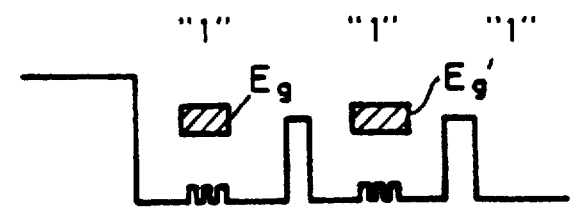

FIG. 8 is a graph of a current (collector current $I_c$)-voltage ($V_{CB}$ between the collector and base) characteristic in the first embodiment. In FIG. 8, the abscissa axis shows a voltage $V_{CB}$ between the collector and the base, and the ordinate axis shows a collector current $I_c$.

As apparent from FIG. 8, when the voltage $V_{BE}$ between the base and the emitter is below the voltage ΔE/e corresponding to the position of the mini-band gap Eg and above (ΔE–MB)/e or above (ΔE+ Eg)/e, a volt-ampere characteristic in an usual HET is obtained. That is, the collector current $I_c$ becomes large. However, when the voltage $V_{BE}$ between the base and the emitter is in the range of ΔE to ΔE+ Eg the current $I_c$ becomes substantially zero.

Therefore, the transconductance, which has become standard when a transistor is used as a high speed switching element, is greatly increased. Further, the first embodiment has special functions such that, since the thickness of the superlattice 6 is very small, an extremely high speed switching is possible.

Figure 9:
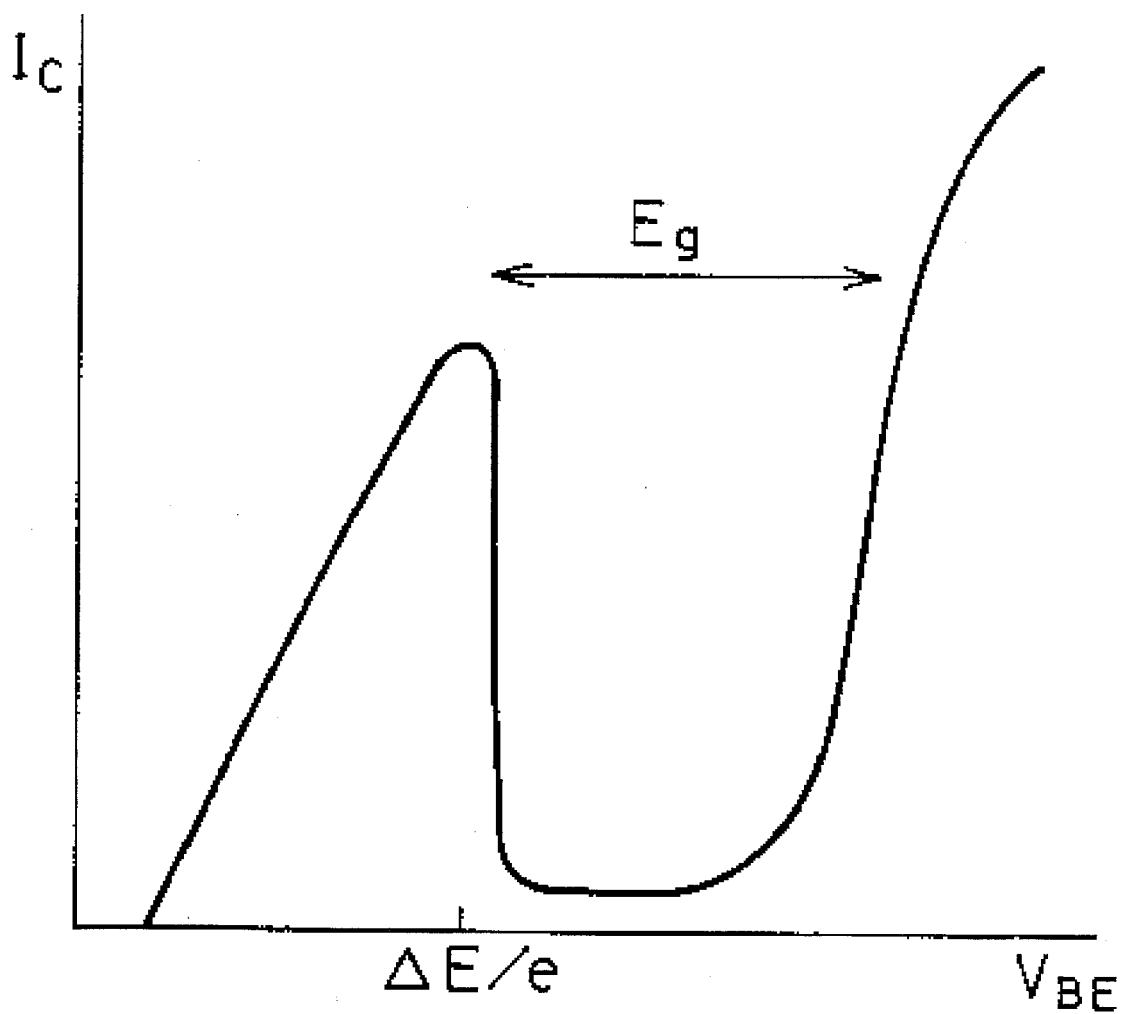
FIG. 9 is a graph of a voltage ($V_{BE}$ between the base and emitter)-current (collector current $I_c$) characteristic in FIG. 6.

FIG. 9 is a graph of a volt ($V_{BE}$ between the base and emitter)-ampere (collector current $I_c$) characteristic in the first embodiment. In FIG. 9, the abscissa shows a voltage $V_{BE}$ between the base and the emitter, and the ordinate shows a collector current $I_c$. The ΔE/e shown in FIG. 9 is substantially 0.5 V, and the Eg is substantially 0.2 V. As apparent from FIG. 9, the first embodiment of a heterojunction semiconductor device having three terminals according to the present invention, has a negative resistance effect.

Figure 2:
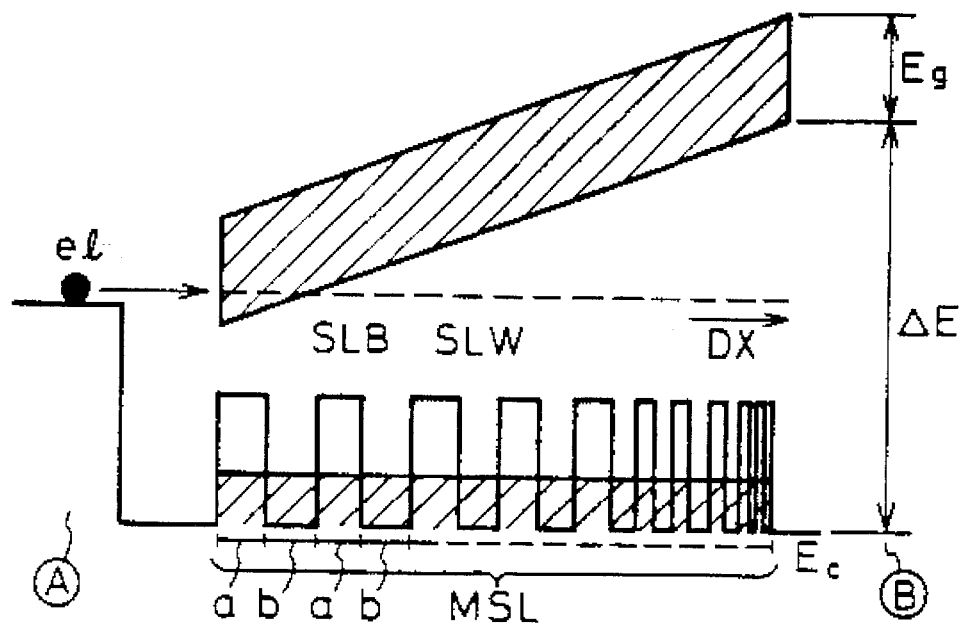
FIG. 2 is an energy band diagram of a modulation superlattice.
Figure 3:
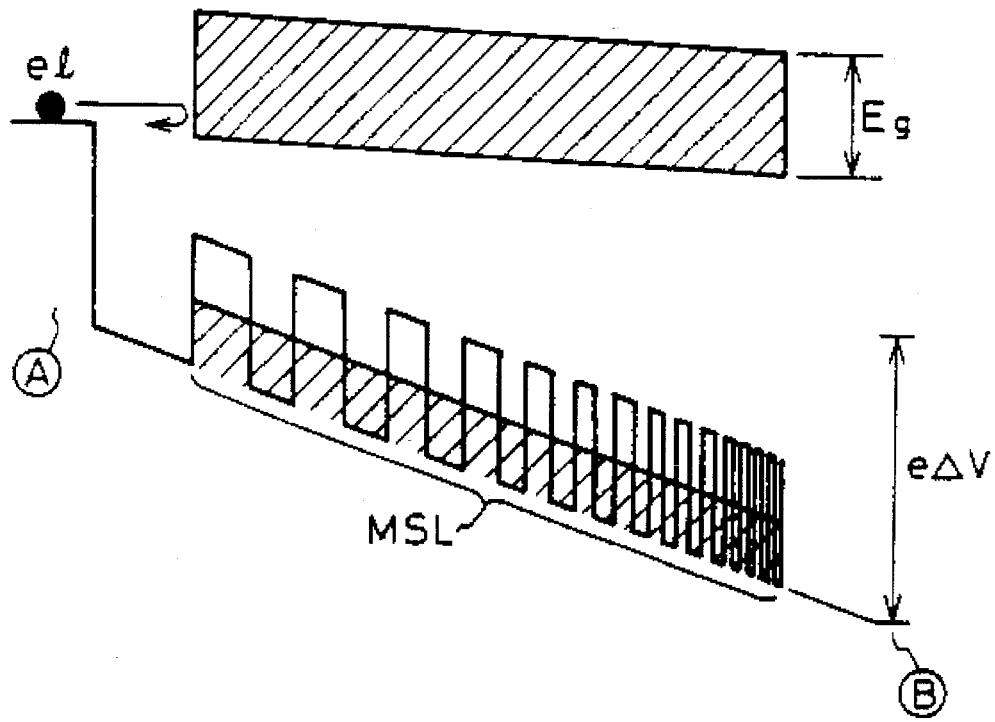
FIG. 3 is an energy band diagram of a modulation superlattice.
Figure 4:
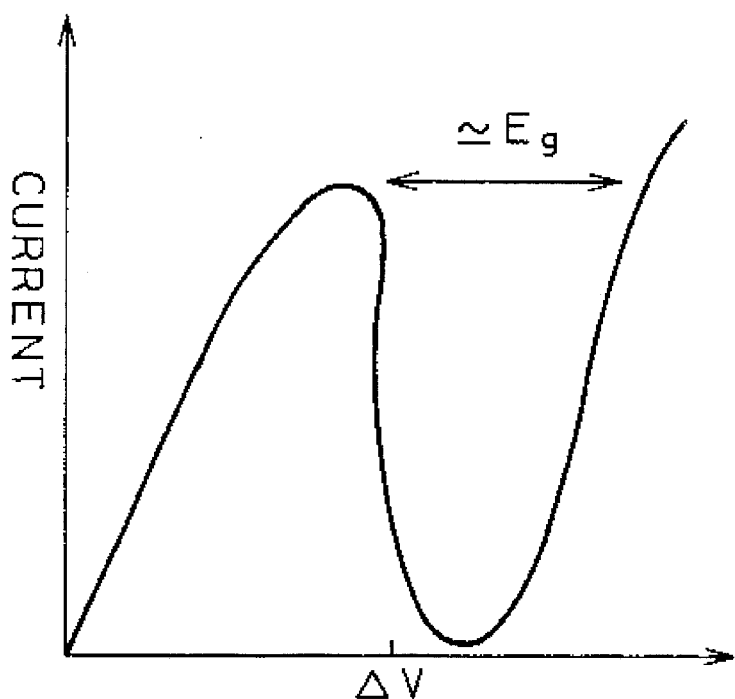
FIG. 4 is a graph of a current-voltage characteristic.
Figure 5:
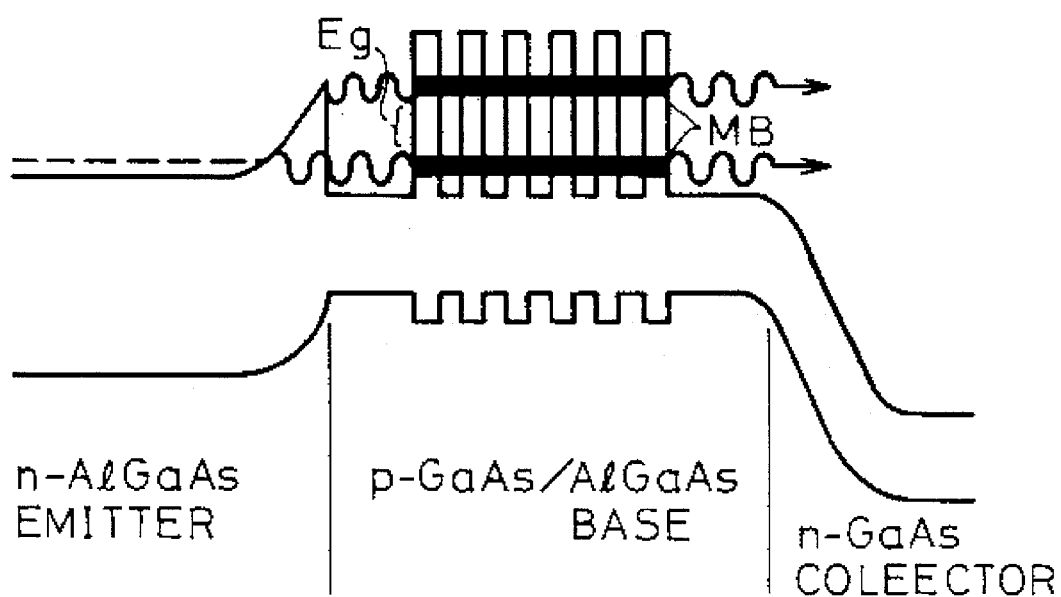
FIG. 5 is an energy band diagram of a conventional npn transistor.

In this embodiment, since the width of the superlattice layers 6B and 6W are so small that the width of the mini-band gap MB is very large, i.e., 0.35 eV and the width of mini-band gap Eg is very large, i.e., 0.2 eV, the characteristic shown in FIG. 9 has a wider N shape characteristic than the prior art in FIG. 5. Furthermore, in the present invention, since the base layer has the same conductivity as the emitter and collector layers, i.e., unipolar type transistor, it is possible to apply a large voltage between the emitter and base layers.

According to the present invention, the width of the well layer of a superlattice SL is so thin that the width of a mini-band MB is very wide to the extent that the energy level of the mini-band gap Eg is higher than the energy height of the barrier layer SLB of the superlattice SL. The well width should be at least less than 30 Å.

Figure 10A:
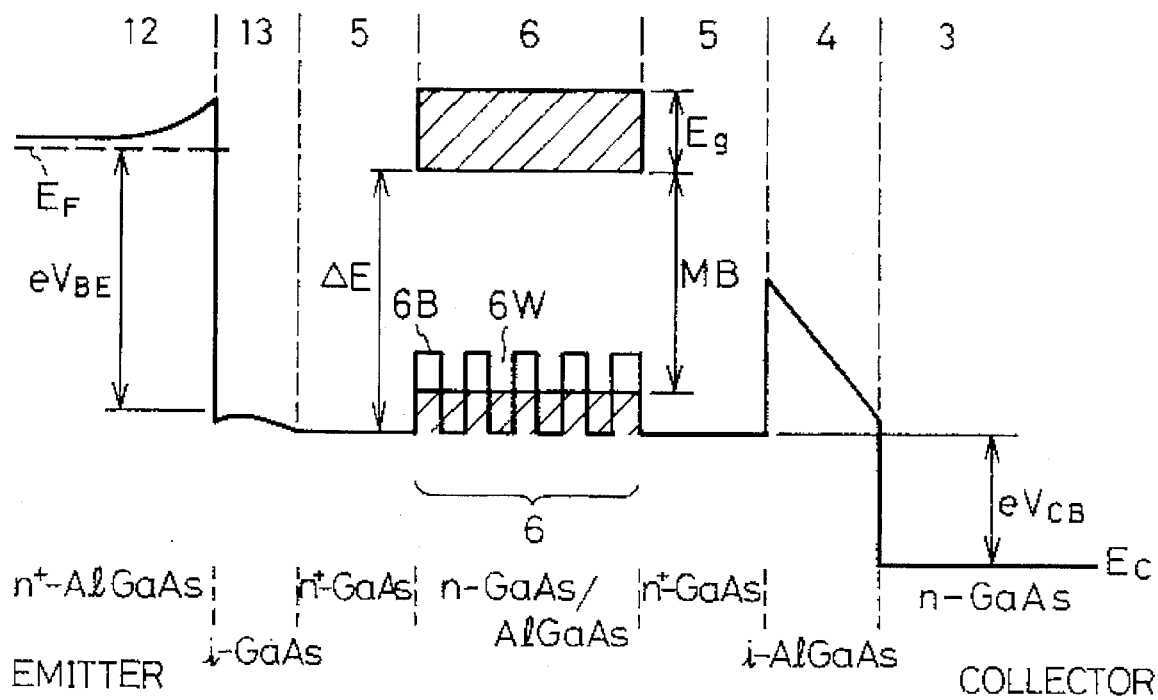
FIG. 10A is an energy band diagram of a second embodiment under a bias condition according to the present invention.

FIG. 10A is an energy band diagram of a second embodiment under a bias condition according to the present invention. The same symbols used in FIGS. 10A and 10B denote the same elements.

In FIG. 10A, reference numeral 12 denotes an $n^+$-type $Al_xGa_{1-x}As$ (x=0.4) emitter layer, 13 an i-type GaAs heterojunction layer, and $E_F$ a Fermi level.

In the first embodiment explained above, electrons are injected from the emitter layer 8 to the base layer 5 while tunnelling through the emitter side potential barrier layer 8, to make hot electrons.

On the other hand in the second embodiment as shown in FIG. 10, a single heterojunction is used in place of the emitter side potential barrier layer 7. And the emitter layer 8 has a smaller electron affinity than the base layer 5.

In the second embodiment, an emitter layer 12 is formed by an $n^+$-type GaAlAs, and an i-type GaAs heterojunction layer 13 is interposed between the emitter layer 12 and an $n^+$-type GaAs base layer 5.

In the second example, substantially the same characteristic as that of the first example can be obtained.

Figure 10B:
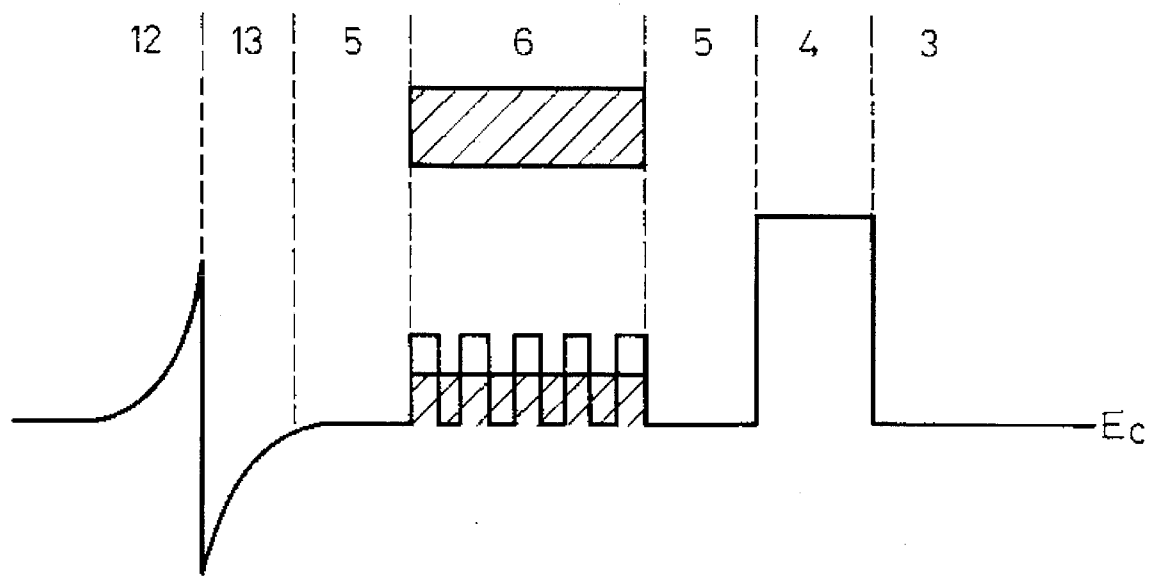
FIG. 10B is an energy band diagram of the second embodiment under an equilibrium bias condition.

FIG. 10B is an energy band diagram of the second embodiment in an equilibrium bias condition.

Figure 11:
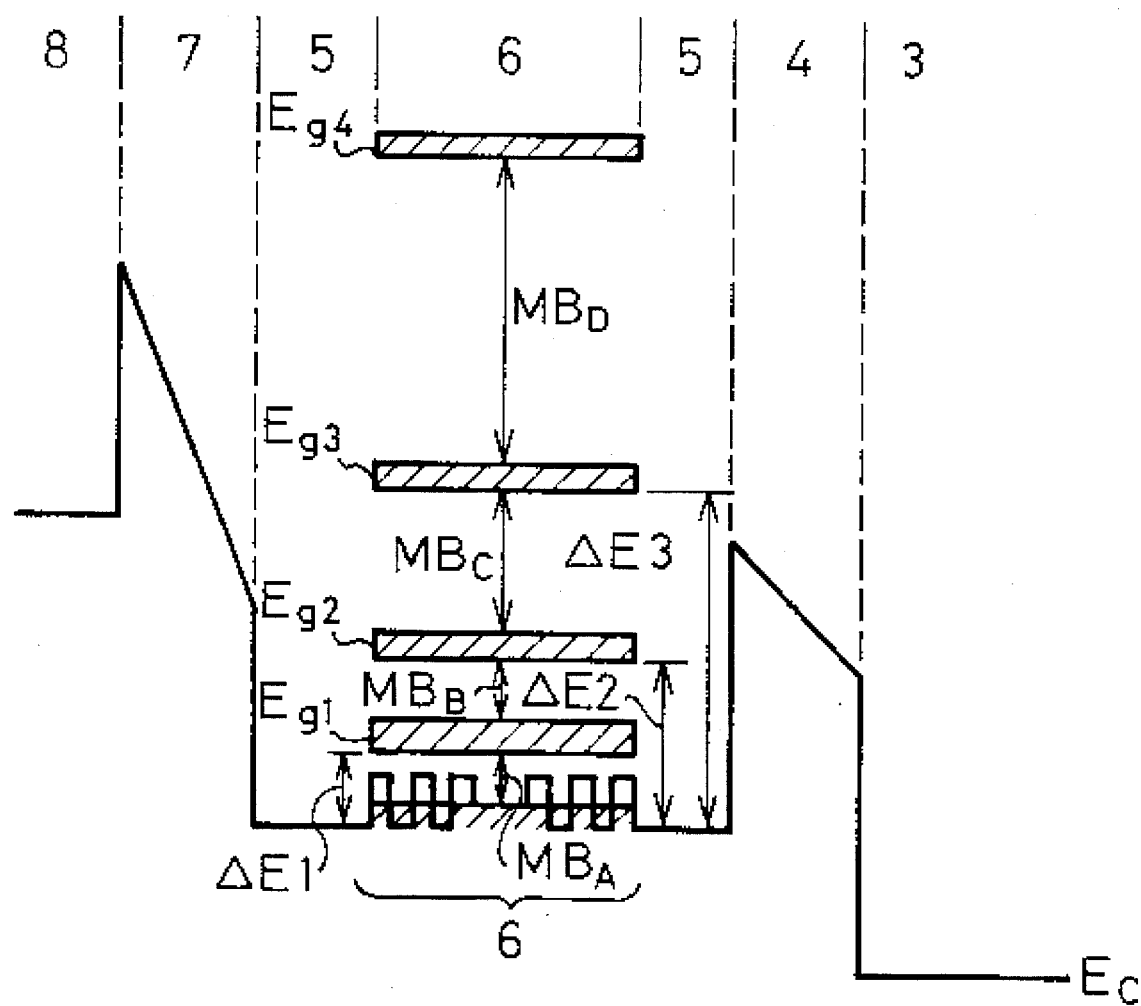
FIG. 11 is an energy band diagram of a third embodiment under a bias condition according to the present invention.

FIG. 11 is an energy band diagram of a third embodiment under a bias condition according to the present invention. The same reference numbers used in FIG. 11 denote the same elements.

In FIG. 11, marks $Eg_1$, $Eg_2$, $Eg_3$, and $Eg_4$ denote mini-band gaps, and $\Delta E1$, $\Delta E2$, $\Delta E3$ ... denote positions of the mini-band gaps.

As shown in FIG. 11, in the third embodiment, a plurality of mini-band gaps appear near the energy level of the injected electrons. This structure shown by the energy band diagram can be obtained by selecting the material of the superlattice 6 and the period thereof.

Figure 12:
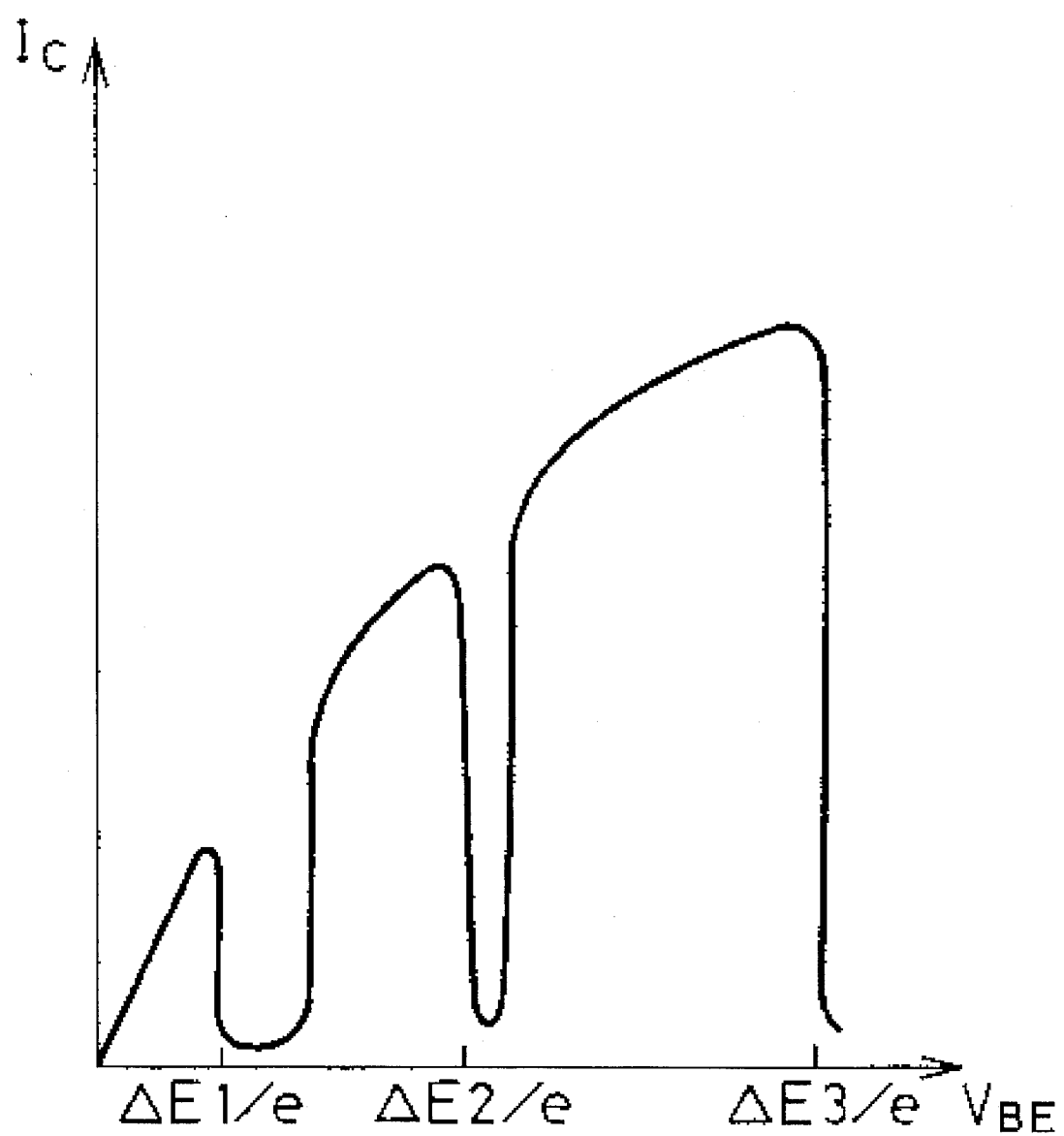
FIG. 12 is a base emitter voltage-collector current characteristic of FIG. 11.

FIG. 12 is a graph of the volt ($V_{BE}$ between the base and the emitter)-ampere (collector current $I_C$) characteristic. The abscissa is a voltage $V_{BE}$ between the base and the emitter, and the ordinate is a collector current $I_c$.

As apparent from FIG. 12, when a base-emitter voltage $V_{BE}$ is applied so that the mini-band gaps $Eg_1$, $Eg_2$ ... come to positions corresponding to the energy levels of the injected electrons, the position of the collector current $I_c$ is lowered.

FIGS. 13A to 13D are energy band diagrams of a fourth embodiment according to the present invention.

In FIGS. 13A to 13D, reference numeral 14 denotes a superlattice and Eg' denotes a mini-band gap. In the fourth embodiment, superlattices 6 and 14 are formed and act as current controllers. The size of the current controller region is such that it is below the electron mean free path.

This example forms an AND circuit having of two gates, while using the reflection of the electrons from the mini-band gap Eg and Eg'.

Figure 13A:
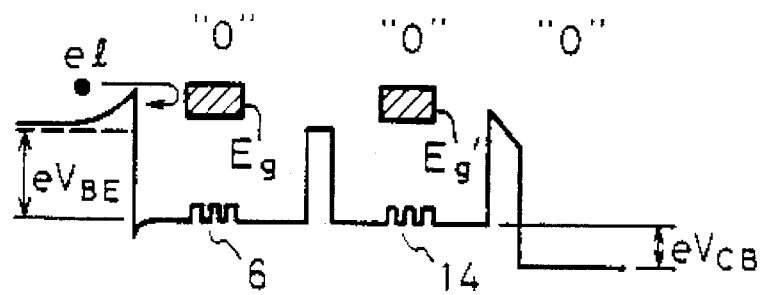
FIGS. 13A to 13D are energy band diagrams of a fourth embodiment according to the present invention.

In the state of mini-band gap Eg and Eg' shown in FIG. 13A, the gate inputs are "0" and "0" and the output is "0".

Figure 13B:
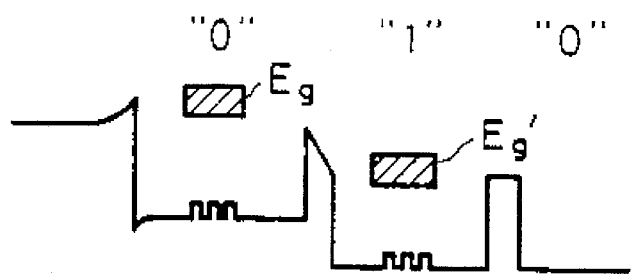

In the state of the mini-band gap Eg and Eg' shown in FIG. 13B, the gate inputs are "0" and "1" and the output is "0".

Figure 13C:
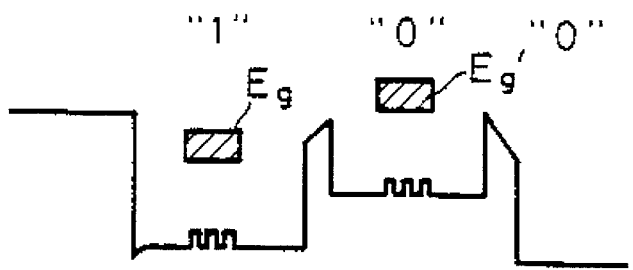

In the state of the mini-band gap Eg' and Eg" shown in FIG. 13C, the gate inputs are "1" and "0" and the output is "0".

Figure 13D:
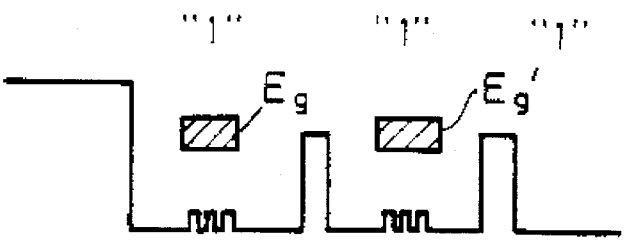
Figure 1:
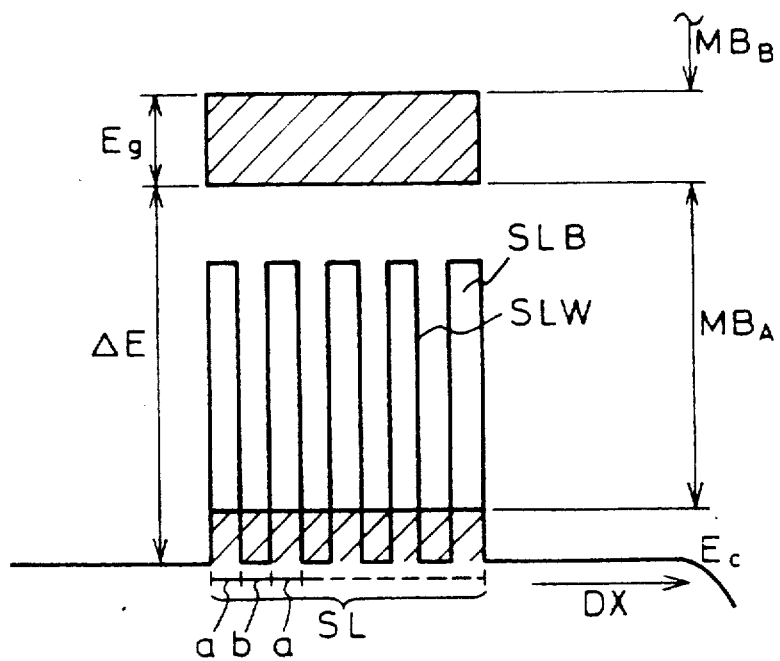
FIG. 1 is an energy band diagram of a mini-band gap.
Figure 2:
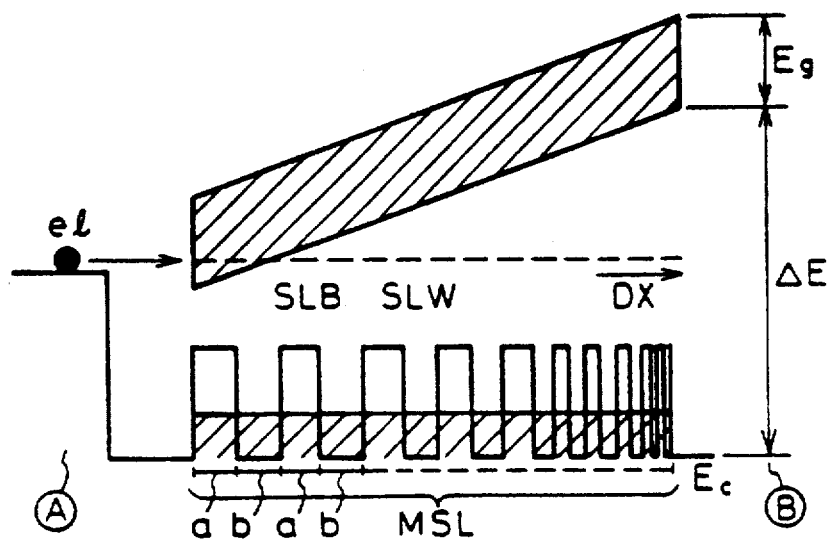
Figure 3:
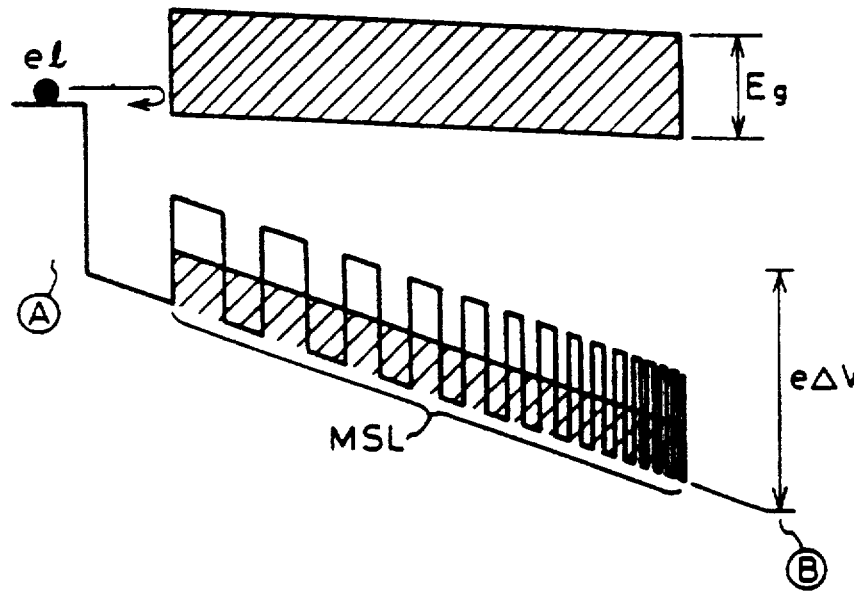
Figure 4:
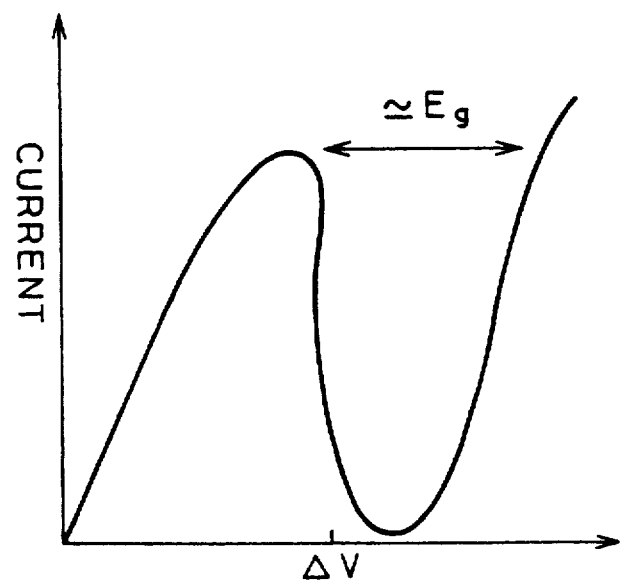
Figure 5:
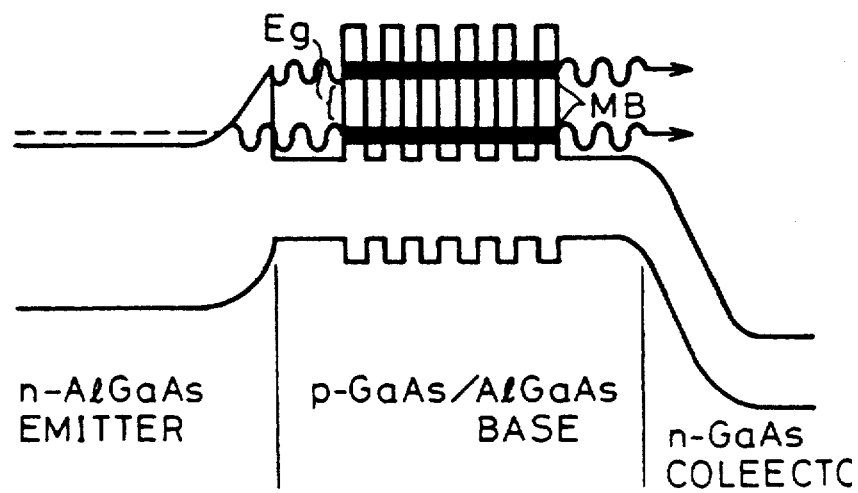
Figure 6:
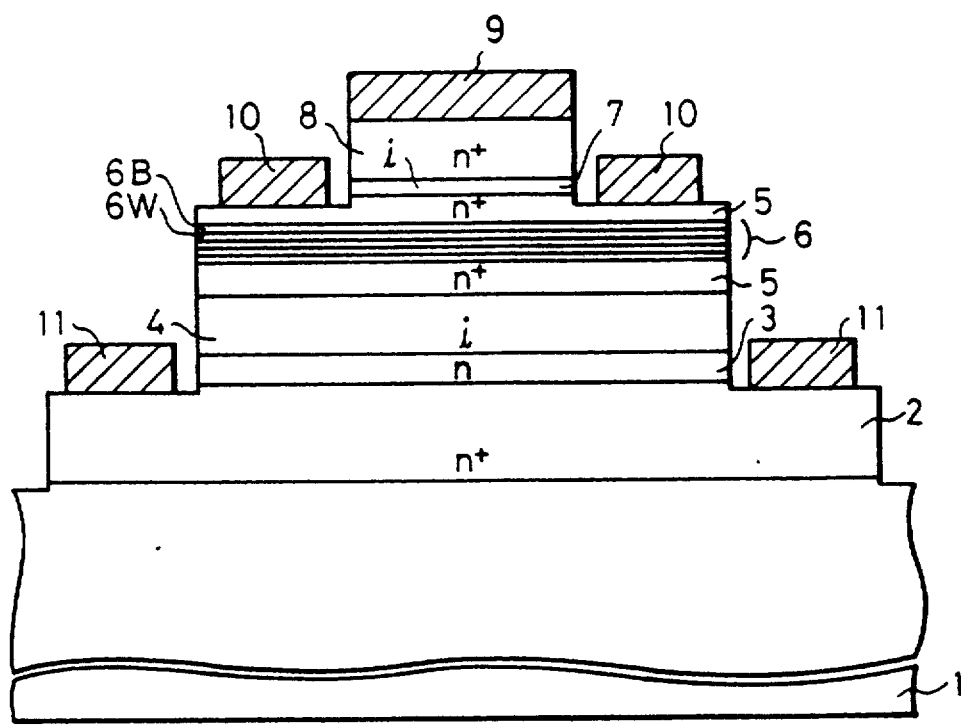
Figure 7A:
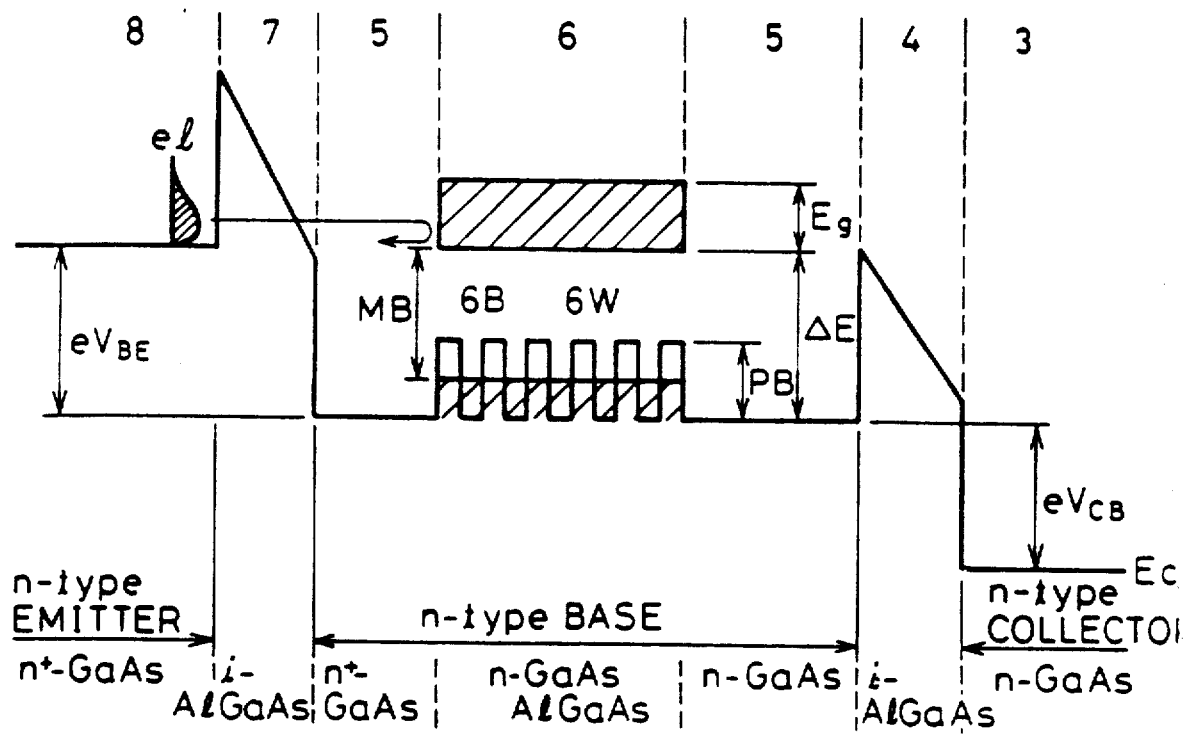
Figure 7B:
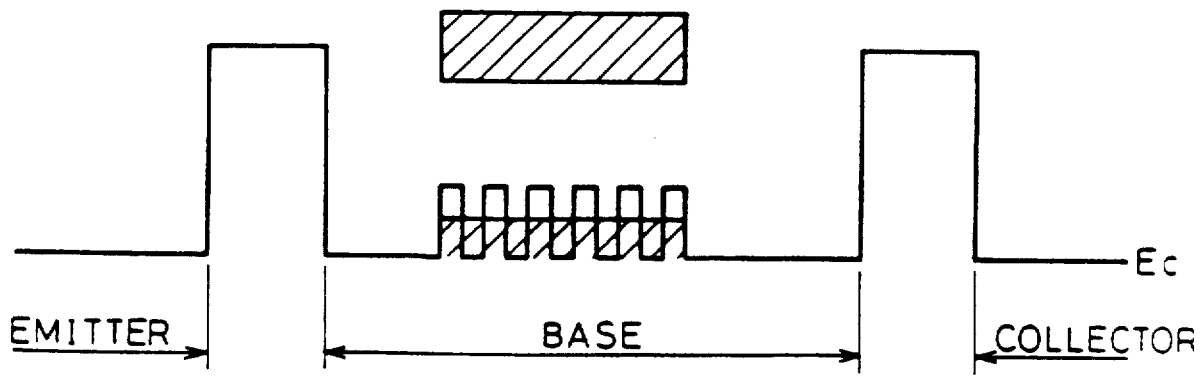

In the state of the mini-band gaps Eg and Eg' shown in FIG. 13D, the gate inputs are "1" and "1" and the output is "1".

In above mentioned first to fourth embodiment, GaAs/GaAlAs type semiconductor materials are used as the semiconductor materials. However, the semiconductor materials are not limited to such a combination and heterojunction forming semiconductor materials may be advantageously used. The semiconductor device is not limited to an HET structure, but also can be used as heterojunction semiconductor device having a transistor structure. As carriers in the present invention, both electrons and holes can be used. That is, a ppp type unipolar transistor can be applied to the present invention. Of course, all the emitter, base, and collector layers can be not only semiconductor material but also some appropriate metal.

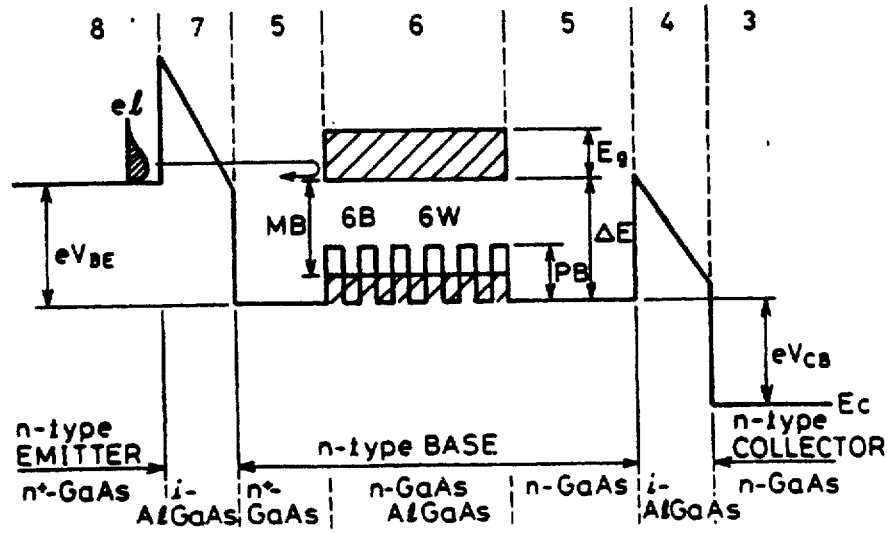

I claim:

1. A semiconductor device comprising:
   an unipolar transistor comprising:
     a collector layer;
     a base layer formed above said collector layer and including two low resistance layers maintained at the same potential;
     a collector side barrier layer provided between said collector layer and said base layer;
     an emitter layer formed above said base layer;
     an emitter side barrier layer provided between said base layer and said emitter layer and on a first one of said two low resistance layers and having a thickness for tunneling carriers from said emitter layer;
     a base electrode contacting one of said two low resistance layers; and
     superlattice means included in said base layer and formed between said two low resistance layers, said superlattice means comprising:
       a plurality of thin barrier layers having substantially the same thickness; and
       a plurality of thin well layers, having substantially the same thickness, for forming a mini-band and a mini-bandgap provided within said mini-band, said mini-band and said mini-bandgap being placed above a bottom of a conduction band Ec of said plurality of thin barrier layers of said superlattice means; and
     bias means for applying a voltage between said emitter and base layers such that said injected carriers flow through said emitter side barrier layer and move through said mini-band.

2. A semiconductor device according to claim 1, wherein the thickness of said thin well layers in said superlattice means is such that the energy level of the mini-band gap is greater than a conduction band level of said thin barrier layers.

3. A semiconductor device according to claim 1, wherein the thickness of said thin well layers is less than 30 Å.

4. A semiconductor device according to claim 1, wherein
said emitter layer is an n-type semiconductor layer;
said emitter side barrier layer is one of an intrinsic type semiconductor layer and insulator layer;
said base layer is an n-type semiconductor layer;
said collector side barrier layer is an intrinsic type semiconductor layer; and
said collector layer is n-type semiconductor layer.

5. A semiconductor device comprising:
an unipolar transistor comprising:
a collector layer;
a base layer formed above said collector layer and having a first electron affinity and including two low resistance layers maintained at the same potential;
an emitter side barrier layer formed above a portion of said base layer;
a collector side barrier layer provided between said collector layer and said base layer;
an emitter layer formed on a first of said two low resistance layers of said base layer and having a second electron affinity less than that of said first electron affinity, carriers being injected from said emitter layer into said base layer by applying a predetermined voltage between said emitter and base layers;
a base electrode contacting one of said low resistance layers and formed at a side of said emitter layer;
superlattice means included in said base layer and formed between said two low resistance layers, comprising:
a plurality of thin barrier layers having substantially the same thickness; and
a plurality of thin well layers, having substantially the same thickness for forming a mini-band, a mini-bandgap provided between the mini-band, said mini-band and said mini-bandgap being placed above a bottom of the conduction band Ec of said plurality of thin barrier layers of said super-lattice means; and
bias means for applying a voltage between said emitter and base layers such that said injected carriers flow through said emitter side barrier layer and move through said mini-band.

6. A semiconductor device according to claim 5, wherein the thickness of said thin well layers in said superlattice means is such that the energy level of said mini-band gap is greater than said conduction band of said thin barrier layers.

7. A semiconductor device according to claim 5, wherein the thickness of said thin well layers is less than 30 Å.

8. A semiconductor device according to claim 5, wherein:
said emitter layer is an n-type semiconductor layer;
said emitter side barrier layer is one of an intrinsic type semiconductor layer and insulator layer;
said base layer is an n-type semiconductor layer;
said collector side barrier layer is an intrinsic type semiconductor layer; and
said collector layer is an n-type semiconductor layer.

* * * * *

UNITED STATES PATENT AND TRADEMARK OFFICE
CERTIFICATE OF CORRECTION

PATENT NO. : 5,543,749

DATED : August 6, 1996

INVENTOR(S) : Yuji Awano

It is certified that error appears in the above-identified patent and that said Letters Patent is hereby corrected as shown below:

The title page should be deleted and substitute therefor the attached Title page.
Title page, item [57] Abstract: line 9, change "layers,the" to --layers. The--.
Drawings:

Delete Drawing sheets 1-11, and substitute therefor the Drawing sheets consisting of Figs 1-11, as shown on the attached pages.

Col. 2, line 7, change ". A new" to --: A New--;
line 8, change "negative differential resistance" to --Negative Differential Resistance--;
line 36, change "electron" to --electrons--;
line 58, change "base, the" to --base. The--.

Col. 3, line 55, change "respectively, an" to --respectively. An--.

Col. 6, line 13, change "Eg' and Eg''" to --Eg and Eg'--.

Signed and Sealed this

Twelfth Day of May, 1998

Attest:

BRUCE LEHMAN

Attesting Officer

Commissioner of Patents and Trademarks

United States Patent [19]

Awano

[11] Patent Number: 5,543,749
[45] Date of Patent: Aug. 6, 1996

[54] RESONANT TUNNELING TRANSISTOR

[75] Inventor: Yuji Awano, Tokyo, Japan

[73] Assignee: Fujitsu Limited, Kawasaki, Japan

[21] Appl. No.: 363,989

[22] Filed: Dec. 27, 1994

Related U.S. Application Data

[63] Continuation of Ser. No. 985,243, Dec. 2, 1992, abandoned, which is a continuation of Ser. No. 690,396, Apr. 25, 1991, abandoned, which is a continuation of Ser. No. 416,004, Oct. 2, 1989, abandoned, which is a continuation of Ser. No. 323,244, Mar. 13, 1989, abandoned, which is a continuation of Ser. No. 25,652, Mar. 13, 1987, abandoned.

[30] Foreign Application Priority Data

Mar. 13, 1986 [JP] Japan ................................. 61-53725

[51] Int. Cl.$^6$ .......................... H01L 29/737; H01L 29/15
[52] U.S. Cl. ...................... 327/570; 257/15; 257/17; 257/23; 257/26; 257/29
[58] Field of Search ................................. 357/16, 4, 12; 257/15, 17, 23, 25, 26, 29; 327/570

[56] References Cited

U.S. PATENT DOCUMENTS

| 4,205,329 | 5/1980 | Dingle et al. | 357/16 |
| 4,396,931 | 8/1983 | Dumke et al. | 357/16 |
| 4,617,724 | 10/1986 | Yokoyama et al. | 357/16 |
| 4,620,206 | 10/1986 | Ohta et al. | 357/16 |
| 4,712,121 | 12/1987 | Yokoyama | 357/16 |

FOREIGN PATENT DOCUMENTS

| 0070211 | 1/1983 | European Pat. Off. | 357/16 |
| 0068064 | 5/1983 | European Pat. Off. | 357/4 |
| 0133342 | 2/1985 | European Pat. Off. | 357/16 |
| 0159273 | 10/1985 | European Pat. Off. | 357/4 |
| 2607940 | 9/1977 | Germany | 357/16 |
| 58-142574 | 8/1983 | Japan | 357/4 |
| 60-10775 | 1/1985 | Japan | 357/16 |
| 62-229878 | 10/1987 | Japan | 357/16 |
| 2128026 | 9/1983 | United Kingdom | 357/16 |

OTHER PUBLICATIONS

"Resonant Tunneling Transistor with Quantum Well Base and High-Energy Injection: A New Negative Differential Resistance Device", Federico Capasso et al., J. Appl. Phys. 58(3), Aug. 1, 1985, pp. 1366–1368.
"New Negative-Resistance Device By A Chirp Superlattice", Electronics Letters, Sep. 29, 1983, vol. 19, No. 20, 822–823.
I.B.M. Tech. Discl. Bulletin vol. 29, No. 7, Dec. 1986.
Chen et al. "Enhanced Ballistic Transport in IAGaAs/In-AlAs Hot Electron Transistor." Aug. 24, 1987, 1254–1255 of Appl. Physics. 357434.

*Primary Examiner*—William D. Larkins
*Attorney, Agent, or Firm*—Staas & Halsey

[57] ABSTRACT

A heterojunction semiconductor device includes an unipolar transistor having, a collector layer, a base layer, a collector side barrier layer provided between the collector layer and base layer, an emitter layer, and an emitter side barrier layer provided between the base layer and the emitter layer. The emitter side barrier layer has a thickness for tunneling a carrier from the emitter and base layer and injecting the carrier into the base layer according to a predetermined voltage applied between the emitter and base layers, the base layer includes a superlattice structure. The superlattice structure includes a plurality thin barrier layers and a thin well layer for forming a mini-band through which the injected carrier can move and a mini-band gap with which the injected carrier collides.

8 Claims, 11 Drawing Sheets